United States Patent
Thapa et al.

(10) Patent No.: US 9,923,050 B2
(45) Date of Patent: Mar. 20, 2018

(54) SEMICONDUCTOR WAFER AND A METHOD FOR PRODUCING THE SEMICONDUCTOR WAFER

(71) Applicants: Siltronic AG, Munich (DE); IMEC VZW, Leuven (BE)

(72) Inventors: Sarad Bahadur Thapa, Burghausen (DE); Ming Zhao, Leuven (BE); Peter Storck, Burghausen (DE); Norbert Werner, Tengling (DE)

(73) Assignees: SILTRONIC AG, Munich (DE); IMEC VZW, Leuven (BE)

( * ) Notice: Subject to any disclaimer, the term of this patent is extended or adjusted under 35 U.S.C. 154(b) by 0 days.

(21) Appl. No.: 15/023,553

(22) PCT Filed: Sep. 11, 2014

(86) PCT No.: PCT/EP2014/069338
§ 371 (c)(1),
(2) Date: Mar. 21, 2016

(87) PCT Pub. No.: WO2015/043961
PCT Pub. Date: Apr. 2, 2015

(65) Prior Publication Data
US 2016/0233293 A1    Aug. 11, 2016

(30) Foreign Application Priority Data

Sep. 24, 2013 (EP) .................................... 13185824
Dec. 17, 2013 (EP) .................................... 13197888

(51) Int. Cl.
*H01L 29/04*  (2006.01)
*C30B 25/18*  (2006.01)
(Continued)

(52) U.S. Cl.
CPC ............ *H01L 29/045* (2013.01); *C30B 25/18* (2013.01); *C30B 25/183* (2013.01);
(Continued)

(58) Field of Classification Search
CPC ............. H01L 21/0254; H01L 29/2003; H01L 21/02433; H01L 29/04
(Continued)

(56) References Cited

U.S. PATENT DOCUMENTS

2008/0173971 A1*  7/2008  Sharma .................... A01H 5/10
                                                                257/506
2009/0008647 A1   1/2009  Li et al.
(Continued)

FOREIGN PATENT DOCUMENTS

TW          200947750        11/2009

OTHER PUBLICATIONS

Keller et al., "Growth and Characterization of N-polar GaN and AlGaN/GaN HEMTs on (111) silicon", Phys. Status Solidi C 8, No. 7-8, 2086-2088, DOI 10.1002/pssc.201000958; Wiley Online Library, Copyright 2011, Wiley-VCH, 3 pages.
(Continued)

*Primary Examiner* — Marc Armand
(74) *Attorney, Agent, or Firm* — Brooks Kushman P.C.

(57) ABSTRACT

A semiconductor wafer has a silicon single crystal substrate having a top surface and a stack of layers covering the top surface, the stack of layers containing an AlN nucleation layer covering the top surface of the silicon single crystal substrate, wherein the top surface of the silicon single crystal substrate has a crystal lattice orientation which is off-oriented with respect to the {111}-plane, the normal to the top surface being inclined with respect to the <111>-direction toward the <11-2>-direction by an angle θ of not less than 0.3° and not more than 6°, the azimuthal tolerance of
(Continued)

the inclination being ±0.1°; and an AlGaN buffer layer which covers the AlN nucleation layer and contains one or more $Al_xGa_{1-x}N$ layers, wherein $0<x<1$.

12 Claims, 3 Drawing Sheets

(51) Int. Cl.
  *C30B 29/40* (2006.01)
  *H01L 21/02* (2006.01)
  *H01L 29/16* (2006.01)
  *H01L 29/20* (2006.01)
  *H01L 29/205* (2006.01)

(52) U.S. Cl.
  CPC ........ *C30B 29/403* (2013.01); *H01L 21/0254* (2013.01); *H01L 21/0262* (2013.01); *H01L 21/02381* (2013.01); *H01L 21/02433* (2013.01); *H01L 21/02458* (2013.01); *H01L 21/02505* (2013.01); *H01L 29/16* (2013.01); *H01L 29/2003* (2013.01); *H01L 29/205* (2013.01)

(58) Field of Classification Search
  USPC ........................................... 257/76
  See application file for complete search history.

(56) References Cited

U.S. PATENT DOCUMENTS

2009/0246944 A1  10/2009  Keller et al.
2009/0278165 A1  11/2009  Chang et al.
2013/0082274 A1*  4/2013  Yang ..................... H01L 33/12
                                                    257/76

OTHER PUBLICATIONS

Saito et al., "Measurement of misorientation of AlN layer grown on (111)Si for freestanding substrate," Phys. Status Solidi C 6, No. S2, S293-S296 (2009) / DOI 10.1002/pssc.200880787; Wiley Interscience, Copyright 2009, Wiley-VCH, 4 pages.

SEMI MF1241-95, "Terminology of Silicon Technology," Copyright SEMI 2003, (XP040455068), 1 page.

* cited by examiner

Fig. 1
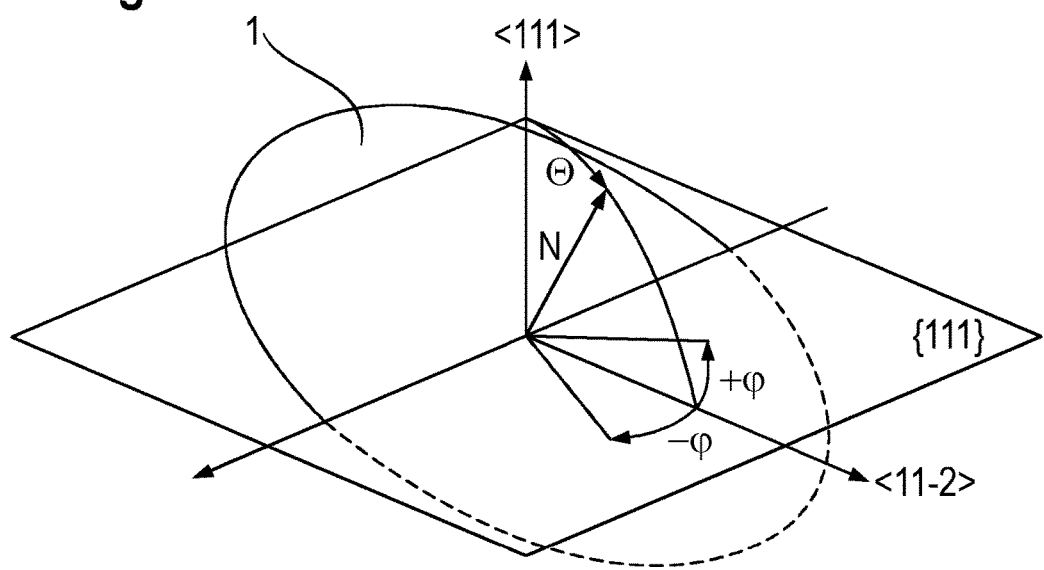
ON             1° OFF
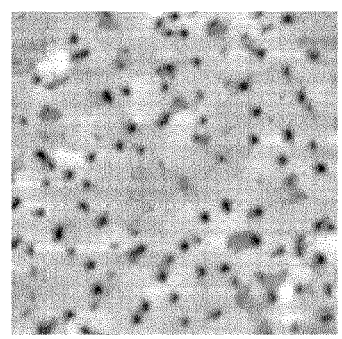 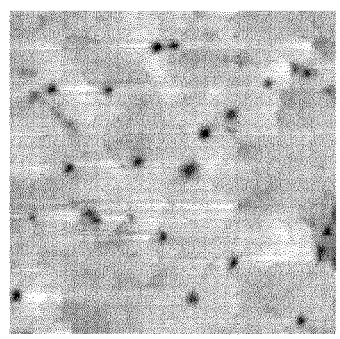
Fig. 2

SEMICONDUCTOR WAFER AND A METHOD FOR PRODUCING THE SEMICONDUCTOR WAFER

CROSS REFERENCE TO RELATED APPLICATIONS

This application is the U.S. National Phase of PCT Appln. No. PCT/EP2014/069338 filed Sep. 11, 2014, which claims priority to European Application No. 13185824.3 filed Sep. 24, 2013, and European Application No. 13197888.4 filed Dec. 17, 2013, the disclosures of which are incorporated in their entirety by reference herein.

BACKGROUND OF THE INVENTION

1. Field of the Invention

The invention is directed to a semiconductor wafer comprising a silicon single crystal substrate having a top surface and a stack of layers covering the top surface, and to a method for producing the semiconductor wafer. Specifically, the invention is directed to a layered semiconductor wafer comprising a silicon single crystal substrate having Group III-nitride heteroepitaxial layers deposited thereon.

2. Description of the Related Art

The layered semiconductor wafer is useful as a source for producing electronic and optoelectronic devices, e.g. high-power devices, high-frequency devices like HEMTs (high electron mobility transistors) and light-emitting devices like LEDs (light emitting diodes) and light-detector devices like UV detectors.

There is a considerable crystal lattice mismatch between silicon and Group III-nitrides like e.g. AlN, AlGaN, GaN, and AlInGaN, and a considerable mismatch with regard to coefficients of thermal expansion (CTE). Crystal lattice mismatch and CTE mismatch induce film stress and cause serious problems like poor crystal quality due to formation of dislocations, as well as a deformation by bowing of the layered semiconductor wafer or even cracking of the Group III-nitride layers or the whole layered semiconductor wafer. CTE mismatch produces significant tensile stress after cooling of the layered semiconductor wafer.

Various attempts have been made to reduce film stress. According to US 2009/0008647 A1 crack-free layers can be grown by using e.g. graded AlGaN buffer layers, AlN interlayers, AlN/GaN or AlGaN/GaN-based superlattices, or an in-situ silicon nitride masking step. Although the presence of e.g. an AlGaN buffer layer may provide some compressive stress which counteracts tensile stress caused by CTE mismatch after cooling from the deposition temperature, this counteracting stress is not sufficient for a complete compensation. As a consequence, the deformation of the layered semiconductor wafer after cooling from the deposition temperature remains an issue.

Therefore, it is an object of the claimed invention to provide a proper solution to this problem.

SUMMARY OF THE INVENTION

The claimed invention is directed to a semiconductor wafer comprising a silicon single crystal substrate having a top surface and a stack of layers covering the top surface, the stack of layers comprising an AlN nucleation layer which covers the top surface of the silicon single crystal substrate, wherein the top surface of the silicon single crystal substrate has a crystal lattice orientation which is off-oriented with respect to the {111}-plane, the normal to the top surface being inclined with respect to the <111>-direction toward the <11-2>-direction by an inclination angle θ of not less than 0.3° and not more than 6°, the azimuthal tolerance of the inclination being ±0.1°; and an AlGaN buffer layer which covers the AlN nucleation layer and comprises one or more $Al_xGa_{1-x}N$ layers, wherein $0<x<1$.

In addition, the claimed invention is directed to a method for producing a semiconductor wafer comprising a silicon single crystal substrate having a top surface and a stack of layers covering the top surface, the method comprising providing the silicon single crystal substrate having a top surface, the top surface of the silicon single crystal substrate having a crystal lattice orientation which is off-oriented with respect to the {111}-plane, the normal to the top surface being inclined with respect to the <111>-direction toward the <11-2>-direction by an inclination angle θ of not less than 0.3° and not more than 6°, the azimuthal tolerance of the inclination being ±0.1°;

depositing on the top surface of the silicon single crystal substrate an AlN nucleation layer which covers the top surface of the silicon single crystal substrate;

depositing an AlGaN buffer layer which covers the AlN nucleation layer and comprises one or more $Al_xGa_{1-x}N$ layers, wherein $0<x<1$.

BRIEF DESCRIPTION OF THE DRAWINGS

FIG. 1 represents a silicon single crystal substrate having an off-oriented top surface in accordance with the invention.

FIG. 2 shows a comparison in regard to the morphology of an AlN layer having 50 nm thickness revealed by AFM technique.

DETAILED DESCRIPTION OF THE PREFERRED EMBODIMENTS

Figure 3:
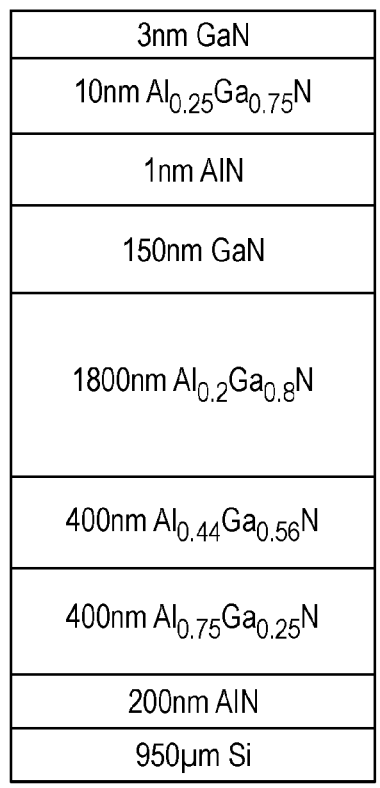
FIG. 3 shows a silicon single crystal substrate which is covered by a stack of layers and represents a typical structure for the fabrication of power devices.

"A layer covering another layer" has the meaning herein that the layer covers the other layer directly or that one or more intermediate layers between the layer and the other layer exist.

"AlGaN buffer layer" means one or more layers having a composition $Al_xGa_{1-x}N$, wherein $0<x<1$. The composition can be constant or graded. A graded composition can be stepwise or continuously graded. Various $Al_xGa_{1-x}N$ layers participating in forming the AlGaN buffer layer can have the same or different compositions. The AlGaN buffer layer may comprise further layers, in particular one or more further AlN layers, one or more GaN layers and a combination of AlN and GaN layers. The top surface of the AlGaN buffer layer is a group-III polar nitride surface.

It is preferred that the stack of layers comprises one or more device forming layers, e.g. layers which are suitable for being processed to electronic or optoelectronic devices. The one or more device forming layers cover the AlGaN buffer layer and have a composition of a binary, ternary or quaternary Group III-nitride consisting of at least one of the elements Al, Ga and In.

The inventors of the present invention found that providing a silicon single crystal substrate having a top surface with the claimed off-orientation will improve the properties of an AlN nucleation layer which is grown on the top surface of the silicon single crystal substrate. The off-orientation of the top surface promotes the coalescence of small islands at the initial stage of the growth and favors the growth of AlN islands having larger dimensions as compared to the dimensions of AlN islands initially growing on an exactly {111}-oriented silicon single crystal substrate. When coalescing during the formation of the AlN nucleation layer, larger AlN islands induce less tensile stress to the AlN layer as compared to smaller AlN islands. As a result the stress state of the AlN nucleation layer has less tensile stress or is even relaxed in comparison to the stress state of an AlN nucleation layer deposited on an exactly {111}-oriented silicon single crystal substrate. In addition, the growth of larger AlN islands promote less pit formation in the AlN nucleation layer. The density of pits in the AlN nucleation layer should be as low as possible since it negatively affects the quality of an AlGaN buffer layer which is grown on the AlN nucleation layer.

Due to reduced tensile stress in the AlN nucleation layer, more compressive stress will build up in the AlGaN buffer layer and, where appropriate, in the device forming layer(s). Accordingly, the potential of the AlGaN buffer layer and, where appropriate, of the device forming layer(s) increases to provide compressive stress which counteracts tensile stress caused by CTE mismatch after cooling of the layered wafer from the deposition temperature. Therefore, deformation of the layered wafer may become considerably less and its bow may be significantly reduced.

The inclination angle $\theta$ between the <111>-direction and the normal to the top surface of the silicon single crystal substrate is chosen to be not less than 0.3° and not more than 6°, preferably not less than 0.8° and not more than 5.5°. In this case terraces are present on the top surface of the silicon single crystal substrate. The terraces promote the initial growth of large AlN islands. If the inclination angle $\theta$ is less than 0.3°, the improvement regarding the properties of the AlN nucleation layer becomes insignificant. If the inclination angle $\theta$ is more than 6°, a homogeneous AlN nucleation layer cannot be grown due to a low aspect ratio of the terraces present on the top surface of the silicon single crystal substrate. However, the growth parameters, e.g. growth temperature, pressure, and ratio between metal organic (MO) precursor and $NH_3$ in the gas phase also influence the AlN nucleation islands and consequently the post-deposition bow of the layered semiconductor wafer. An azimuthal variation tolerance range of the inclination of the normal to the top surface is ±0.1°.

The AlN nucleation layer has a thickness which is preferably not less than 20 nm and not more than 500 nm.

The silicon single crystal substrate is preferably a silicon single crystal wafer having a polished front side representing the off-oriented top surface. Alternatively, a silicon single crystal epi-wafer or a SOI-wafer can be used as the silicon single crystal substrate. It is preferred that the silicon single crystal substrate has a circular shape with a diameter which is not less than 150 mm. It is also preferred that the silicon single crystal substrate is provided with one or more orientation marks, e.g. with a flat or a notch.

It is further preferred to grow the AlN nucleation layer, the AlGaN buffer layer and, where appropriate, the device forming layer(s) using metal-organic chemical vapor deposition (MOCVD) in a conventional MOCVD-reactor. The temperature of the surface on which the layer is deposited is preferably 700° C. or more and 1200° C. or less, if the deposited layer comprises Al, and preferably 550° C. or more and 1150° C. or less, if Al is absent in the deposited layer.

The invention is further explained by referring to figures and examples.

According to FIG. 1, the silicon single crystal substrate has a top surface 1 which is off-oriented with respect to the {111}-plane. The normal N to the top surface is inclined with respect to the <111>-direction by an inclination angle $\theta$ which is not less than 0.3° and not more than 6°. The normal N to the top surface 1 is inclined toward the <11-2>-direction. An azimuthal variation tolerance range of the inclination of the normal N to the top surface is plus to minus angle $\varphi$, wherein $\varphi=0.1°$. Angle $\varphi$ represents the angle between the projection of the normal N to the top surface onto the {111}-plane and the <11-2>-direction. The top surface 1 can have any off-orientation which is geometrically equivalent. For example, the normal N to the top surface can be inclined toward the [11-2]-direction, the [1-21]-direction or the [-211]-direction.

EXAMPLES

Polished silicon single crystal wafers having a diameter of 150 mm have been used as a silicon single crystal substrate in accordance with the invention. Group-III nitride layers were deposited in a commercial MOCVD reactor.

AlN Nucleation Layer:

The behavior of the formation of an AlN nucleation layer was studied by growing AlN nucleation layers having a thickness of 10 nm, 50 nm and 350 nm, respectively. The growth was started with a pre-flow of an Al metal-organic precursor, TMAl (trimethylaluminium), before introduction of ammonia into the growth chamber. The temperature of the substrate surface during AlN deposition was 1010° C. FIG. 2 shows a comparison of the morphology of an AlN layer having a thickness of 50 nm revealed by AFM (atomic force microscope) technique. The illustration on the left-hand side depicts an AFM image of an AlN layer which was grown on a (111)-oriented, polished silicon single crystal wafer which is called hereinafter an on-oriented substrate. The illustration on the right-hand side depicts an AFM image of an AlN layer which was grown on a polished silicon single crystal wafer which was off-oriented in accordance with the invention. The inclination angle $\theta$ was 1° and the inclination was exactly toward the [11-2]-direction.

As can be derived from FIG. 2, the pit density was significantly lower when the AlN nucleation layer was grown on the off-oriented substrate. Actually, the pit density was about $1.1 \times 10^{10}/cm^2$ in case the on-oriented substrate was used and about $2.7 \times 10^{9}/cm^2$ in case that the off-oriented substrate was used.

Table 1 displays the results of Raman and x-ray diffraction (XRD) measurements which were performed in order to investigate the stress status and layer quality of a grown AlN nucleation layer having a thickness of 350 nm.

TABLE 1

| thickness (nm) | orientation | AlN $E_2^2$ phonon energy (cm$^{-1}$) | stress (GPa) | XRD(002)FWHM (arc sec) |
| --- | --- | --- | --- | --- |
| 350 | on-oriented | 650.23 | 1.138 | 851 |
| 350 | 1° off-oriented | 650.96 | 1.022 | 650 |

According to table 1, the layer stress was positive, i.e. tensile, with regard to both samples, but less tensile stress was induced in case that the AlN nucleation layer was grown on the off-oriented substrate. After the AlN layer deposition the bow of the layered sample with on-orientation was −29.15 μm (average bow value) and more concave than the bow of the layered sample with off-orientation which was −27.16 μm. This corroborates that the AlN epi layer is less tensile strained on the off-oriented Si(111) substrate than on the on-oriented Si(111) substrate. The full width at half maximum (FWHM) data as determined by XRD can be related to the presence of layer defects. The smaller FWHM is attributed to a lower number of crystal defects detected in the AlN layer covering the off-oriented substrate.

AlGaN Buffer Layer:

The influence of the substrate orientation on the AlGaN buffer layer was studied in a further experiment. First of all, the AlN nucleation layer was deposited as described in the previous experiment and then the AlGaN buffer layer was deposited on the AlN nucleation layer and consisted of three layers: $Al_{0.75}Ga_{0.25}N/Al_{0.45}Ga_{0.55}N/Al_{0.19}Ga_{0.81}N$. The growth temperature was 1010° C. The layers had a thickness of 400 nm, 400 nm and 450 nm, respectively, and the $Al_{0.75}Ga_{0.25}N$-layer covered the AlN nucleation layer.

Table 2 displays the results of deformation measurements determining the bow of the layered wafer resolved in x- and y-direction, i.e perpendicular and parallel to the [1-10]-direction.

TABLE 2

| orientation | bow x (μm) | bow y (μm) |
| --- | --- | --- |
| on-oriented | 15.3 | 14.0 |
| 1° off-oriented | 45.5 | 43.1 |

Higher positive bow values in x-direction and y-direction indicated an increased convex bow.

Power Device Stack of Layers:

In a further experiment a layer stack typical for a source to produce double heterojunction-HEMT (DH-HEMT) devices was deposited on polished silicon single crystal wafers which were on-oriented or off-oriented in accordance with the invention. The sequence of layers is shown in FIG. 3. Each layer was deposited at 1010° C.

Figure 4:
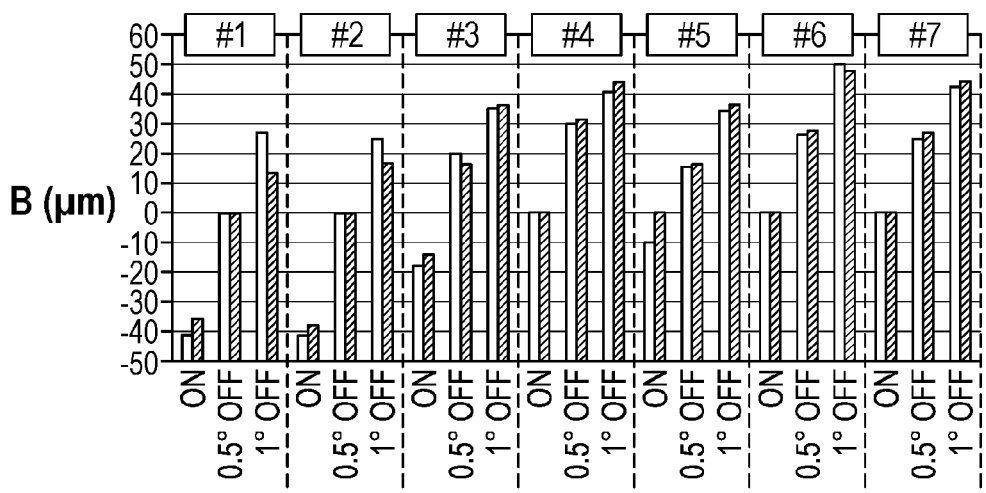
FIG. 4 shows the result of wafer bow measurements of a layered structure according to FIG. 3.

The bow (B) of twenty one layered wafers (three different substrates in each runs) produced in consecutive growth runs (#1 to #7) resolved in x- and y-direction was determined after the deposition of the entire stack. FIG. 4 shows the results of the measurement in relation to the orientation of the substrate, wherein "on" represents an on-oriented substrate, and "0.5 off" and "1 off" a substrate which was off-oriented in accordance with the invention by an inclination angle θ=0.5° and θ=1°, respectively. Left (open) and right (shaded) columns represent the bow values in x- and y-direction, respectively. As shown in FIG. 4, the post-deposition bow values monotonically increase in the favorable convex bow direction as the inclination angle θ increases.

Figure 5:
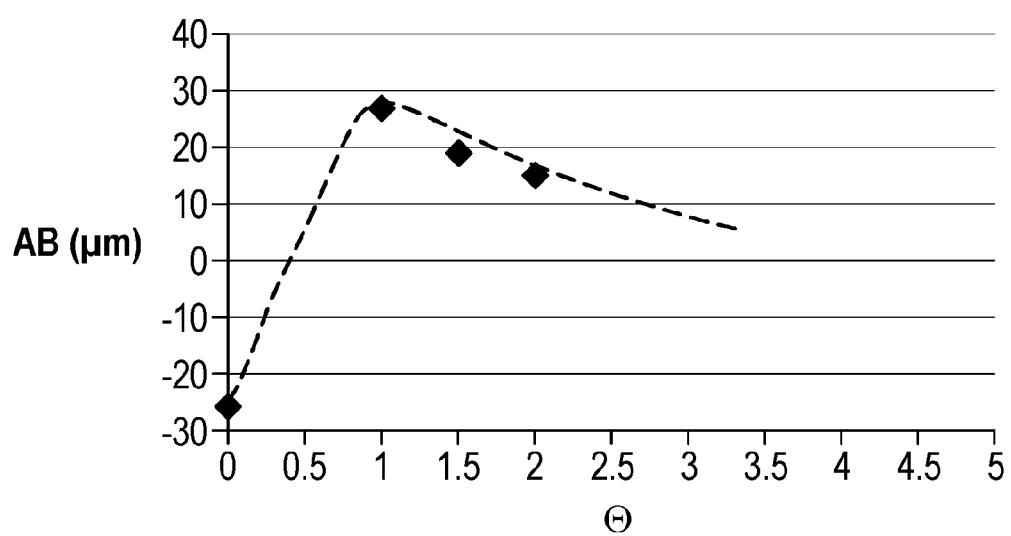
FIG. 5 shows the plot of the bow of a layered structure according to FIG. 3 depending on the inclination angle G.

FIG. 5 shows the plot of the bow of a layered structure according to FIG. 3 in relation to the inclination angle θ. Displayed is the average bow (AB) which means the average of bow in x-direction and y-direction.

A maximum value of bow (28 μm) of the layered wafer was observed for a substrate with 1° off-orientation. Then it decreases when the inclination angle θ is further increased from θ≥1.5°. However, the impact of the off-orientation of the substrate on the post-deposition bow of the layered wafer also depends upon the growth condition of the AlN nucleation layer. The maximum value of the post-deposition bow displayed in FIG. 5 can be shifted beyond an inclination angle θ of 1° if the AlN nucleation layer deposition temperature is lower than 1010° C. The bow of the substrate before deposition is generally within a range of −5 μm to 5 μm, and has negligible influence to the post-deposition wafer bow.

The invention claimed is:

1. A semiconductor wafer comprising a silicon single crystal substrate having a top surface and a stack of layers covering the top surface, the stack of layers comprising
    a) an AlN nucleation layer which has a thickness of not less than 20 nm and not more than 500 nm and covers the top surface of the silicon single crystal substrate, wherein the top surface of the silicon single crystal substrate has a crystal lattice orientation which is off-oriented with respect to the {111}-plane, the normal to the top surface being inclined with respect to the <111>-direction toward the [11-2]-direction, the [1-21]-direction, or the [-211]-direction by an angle θ of not less than 0.3° and not more than 6°, the azimuthal tolerance of the inclination being ±0.1°; and
    b) an AlGaN buffer layer which covers the AlN nucleation layer and comprises one or more $Al_xGa_{1-x}N$ layers, wherein 0<x<1, and wherein a top surface of the AlGaN buffer layer is a Group-III polar nitride surface.

2. The semiconductor wafer of claim 1, wherein the AlGaN buffer layer comprises one or more AlN layers.

3. The semiconductor wafer of claim 1, wherein the AlGaN buffer layer comprises one or more AlN layers.

4. The semiconductor wafer of claim 1, wherein the AlGaN buffer layer comprises one or more GaN layers.

5. The semiconductor wafer of claim 1, wherein the stack of layers comprises one or more device forming layers covering the AlGaN buffer layer and having a composition of a binary, ternary or quaternary Group III-nitride containing at least one of the elements Al, Ga and In.

6. The semiconductor wafer of claim 1, wherein the silicon single crystal substrate is a silicon single crystal wafer having a diameter of 150 mm or more.

7. The semiconductor wafer of claim 2, wherein the AlGaN buffer layer comprises one or more GaN layers.

8. The semiconductor wafer of claim 2, wherein the stack of layers comprises one or more device forming layers covering the AlGaN buffer layer and having a composition of a binary, ternary or quaternary Group III-nitride containing at least one of the elements Al, Ga and In.

9. The semiconductor wafer of claim 4, wherein the stack of layers comprises one or more device forming layers covering the AlGaN buffer layer and having a composition of a binary, ternary or quaternary Group III-nitride containing at least one of the elements Al, Ga and In.

10. A method for producing a semiconductor wafer comprising a silicon single crystal substrate having a top surface and a stack of layers covering the top surface, the method comprising:
    a) providing a silicon single crystal substrate having a top surface, the top surface of the silicon single crystal substrate having a crystal lattice orientation which is off-oriented with respect to the {111}-plane, a normal to the top surface being inclined with respect to the <111>-direction toward the [11-2]-direction, the [1-21]-direction, or the [-211]-direction by an angle θ of not less than 0.3° and not more than 6°, the azimuthal tolerance of the inclination being ±0.1°;

b) depositing on the top surface of the silicon single crystal substrate an AlN nucleation layer which has a thickness of not less than 20 nm and not more than 500 nm and covers the top surface of the silicon single crystal substrate; and
c) depositing an AlGaN buffer layer which covers the AlN nucleation layer and comprises one or more $Al_xGa_{1-x}N$ layers, wherein $0<x<1$, and wherein a top surface of the AlGaN buffer layer is a Group-III polar nitride surface.

11. The method of claim 10, further comprising depositing one or more device forming layers which cover the AlGaN buffer layer and have a composition of a binary, ternary or quaternary Group III-nitride containing at least one of the elements Al, Ga and In.

12. The method of claim 11, wherein the deposition method comprises metal-organic chemical vapor deposition (MOCVD).

* * * * *